United States Patent [19]

Berghaeuser

[11] Patent Number: 4,487,827
[45] Date of Patent: Dec. 11, 1984

[54] PROCESS FOR THE BURNING-IN OF LIGHT-SENSITIVE LAYERS DURING THE PREPARATION OF PRINTING FORMS

[75] Inventor: Günter Berghaeuser, Wiesbaden, Fed. Rep. of Germany

[73] Assignee: Hoechst Aktiengesellschaft, Frankfurt am Main, Fed. Rep. of Germany

[21] Appl. No.: 358,385

[22] Filed: Mar. 15, 1982

[30] Foreign Application Priority Data

Mar. 19, 1981 [DE] Fed. Rep. of Germany ....... 3110632

[51] Int. Cl.³ .............................................. G03F 7/08
[52] U.S. Cl. .................................... 430/302; 430/309; 430/326; 430/330; 430/328
[58] Field of Search ............... 430/302, 326, 328, 330, 430/309

[56] References Cited

U.S. PATENT DOCUMENTS

| | | | |
|---|---|---|---|
| 2,702,243 | 2/1955 | Schmidt | 430/302 |
| 3,046,121 | 7/1962 | Schmidt | |
| 3,589,261 | 6/1971 | Krikelis | |
| 4,093,461 | 6/1978 | Loprest et al. | 430/328 |
| 4,326,018 | 4/1982 | Jargiello | 430/328 |
| 4,356,255 | 10/1982 | Tachikawa et al. | 430/328 |
| 4,396,284 | 8/1983 | Fromson et al. | 430/156 |

FOREIGN PATENT DOCUMENTS

| | | |
|---|---|---|
| 7202150 | 5/1972 | Fed. Rep. of Germany . |
| 7805619 | 8/1978 | Fed. Rep. of Germany . |
| 1154749 | 6/1969 | United Kingdom . |
| 1330139 | 9/1973 | United Kingdom . |
| 1407123 | 9/1975 | United Kingdom . |
| 1413374 | 11/1975 | United Kingdom . |

OTHER PUBLICATIONS

Anon, "Grundlagen der Optischen Strahlung", Phillips Co., p. 14.

Primary Examiner—Charles L. Bowers, Jr.
Attorney, Agent, or Firm—Schwartz, Jeffery, Schwaab, Mack, Blumenthal & Koch

[57] ABSTRACT

The invention relates to a process for the burning-in of positive-working, light-sensitive layers, containing diazo compounds, during the preparation of offset printing forms, by heating the printing plate. In this process, the light-sensitive layer is treated, after exposure and development, with electromagnetic radiation having an infrared fraction, a fraction in the visible region, and an ultraviolet fraction.

5 Claims, No Drawings

PROCESS FOR THE BURNING-IN OF LIGHT-SENSITIVE LAYERS DURING THE PREPARATION OF PRINTING FORMS

The invention relates to a process for the burning-in of exposed and developed, positive-working, light-sensitive layers, containing diazo compounds, during the preparation of offset printing forms.

In the case of positive-working light-sensitive layers, those parts of the light-sensitive layer which have been struck by light during the imagewise exposure of the printing plate become relatively more soluble than the parts not struck by light. As a result of the first-mentioned parts being dissolved away in the developing step, the non-image areas of the later printing form, which are hydrophilic on printing, are formed on the surface of the printing plate after development of the exposed layer, and the image areas which are ink-receptive on printing are formed from the last-mentioned parts.

In practice, it has been found that heating of the exposed and developed printing plate—up to temperatures of about 180° C. and higher, depending on the nature of the support material—from the side of the light-sensitive layer or even from the rear can lead to longer print runs; this procedure is called "burning-in". It is assumed that, inter alia, two factors are responsible for this: on the other hand, mechanical strengthening of the image areas occurs, so that these are less susceptible to damage during storage and printing, due to the action of light for example; on the other hand, the image areas also become more resistant to chemical or physical-chemical attack, which manifests itself, for example, by the fact that they are less readily attacked by printing inks containing organic solvents or by etching media than image areas which have not been burned-in.

The following processes and/or devices for the burning-in of light-sensitive layers have, for example, been disclosed in the state of the art:

German Pat. No. 854,890 (equivalent to U.S. Pat. No. 3,046,121) describes the after-treatment of positive-working light-sensitive layers containing diazo compounds by heating the printing plates carrying these layers. Heating is effected before or after development of the exposed printing plate by treatment with flames, with a hot pressing iron, in a box heated electrically to elevated temperatures or between heated rollers; the intention is to decompose the unexposed diazo compound by the heating and to firmly join the decomposition product to the support material.

German Auslegeschrift No. 1,447,963 (equivalent to British Pat. No. 1,154,749) discloses a process for the preparation of an offset printing form, wherein the printing plates having positive working light-sensitive layers containing o-naphthoquinone-diazide compounds are heated after development to a temperature of at least 180° C. in the presence of a novolak and/or a resol. The resin is either already present in the light-sensitive layer or it is applied in solution to the light-sensitive layer before heating. The level of the heating temperature and the duration of heating are selected such that, due to decomposition of the ink-receptive image areas (not struck by light), a precipitate is formed on those parts of the printing plate which are hydrophilic on printing (and which have been struck by light and removed by the developer); these parts of the printing plate which ae hydrophilic on printing are then cleaned again by an after-treatment. The heating temperature should, in particular, be 200° to 250° C., and the appropriate heating period is then 5 to 60 minutes; heating is carried out in a burning-in oven.

The device for the burning-in of printing plates having an exposed and developed diazo layer according to German Pat. No. 1,955,378 (equivalent to British Pat. No. 1,330,139) operates at a heating temperature of at least 180° C. and, as the heating element, contains a quartz-halogen lamp having a fraction of radiation in the visible spectral region of 10 to 15 percent. These quartz-halogen lamps are said to be distinguished by a relatively short heating-up period, as compared with heating cabinets or infrared (IR) heating bars. In comparison with IR heating bars, they have a considerably larger fraction of radiation in the visible spectral region.

In the process for the preparation of planographic printing forms according to German Offenlegungsschrift No. 2,201,936 (equivalent to British Pat. No. 1,413,374), the exposed and developed light-sensitive layers are warmed from the rear of the printing plate by means of IR radiation, this rear carrying an IR-absorbing layer.

German Utility Model No. 6,901,603 (equivalent to U.S. Pat. No. 3,589,261) describes a device for the development of negative-working, light-sensitive layers, containing photopolymerizable compounds, on flexible support materials; this also comprises an after-exposure step (page 3, paragraph 4; page 5, paragraph 1; page 9, paragraph 4, and page 10) in which lamps emitting UV (ultraviolet) and IR light are employed. This stage is intended, on the one hand, to dry the material after the main developing stage and, on the other hand, to effect an after-exposure of the residual photopolymerizable fractions in the image areas.

German Utility Models Nos. 7,202,150 and 7,805,619 disclose the use in practice of essentially three types of burning-in cabinets for printing plates, namely horizontally or vertically working circulating-air burning-in cabinets or vertically working burning-in cabinets with heating devices based on electromagnetic radiation; heating of the light-sensitive layer by placing the printing plates onto a heated cylinder is also possible.

The burning-in processes disclosed by the state of the art have, however, the following disadvantages:

The processes in which an open flame or heated rollers are used are not adequately reproducible with respect to the temperature generated, they can cause damage to parts of the printing plates, and they do not permit uniform burning-in of the layer.

The processes in which, for example, warmed circulating air is used in a heating cabinet, admittedly give a more readily reproducible temperature setting and make burning-in more uniform, but long heating-up times before and during burning-in must be accepted and, in particular in the case of printing plate support materials based on organic polymers or made of aluminum, the mechanical strength (for example the tensile strength) of the support materials can be adversely affected.

The processes in which electromagnetic radiation being exclusively IR, or having a very high proportion of IR, is employed admittedly can reduce the treatment time from at least 5 to 6 minutes in so-called burning-in cabinets to, for example, about 1 minute, in particular when the distance of the light-sensitive layer from the heat source is reduced, but they then have the undesired side effect of a very strong adverse influence on the mechanical strength of the printing plate support materials.

Although it was already known from the processing of exposed and developed, negative-working printing plates, having photopolymerizable compounds in the light-sensitive layer, to irradiate these in an "after-exposure step" with lamps emitting UV and IR light, such a measure was intended to serve different purposes and, thus, this rather leads away from the subject of the present invention. In fact, these lamps are intended, on the one hand, to serve for drying of the materal and, on the other hand, for the after-exposure of photopolymerizable fractions still remaining in the image areas; i.e., because those parts of the layer which have been struck by light become less soluble in negative-working light-sensitive layers, the irradiation with the lamps having a UV fraction is intended to render those image areas or parts of image areas completely insoluble which have not yet or have only incompletely reached this state (for example those which are nearer to the surface of the support material and which were further away from the light source in the actual exposure stage). This, however, makes it impossible to transfer this teaching without further consideration to the burning-in of positive-working light-sensitive layers, because in this case precisely the opposite conditions prevail, i.e. it had to be assumed initially that irradiation with UV light would have to lead to a higher solubility of the parts of the layer struck by light.

It is the object of the present invention to provide a process for the burning-in of positive-working light-sensitive layers on printing plates, which process can be carried out within a short time, leads to uniformly affected image areas in the layers and influences the mechanical properties of the support material of the printing plates, in particular those of support materials based on aluminum, only in a manner which is tolerable for the field of application.

The starting point of the invention is the known process for the burning-in of exposed and developed, positive-working light-sensitive layers, containing diazo compounds, during the preparation of offset printing forms, by heating the printing plate to at least 180° C. by means of electromagnetic radiation which contains an infrared fraction and a fraction in the visible region. In the process according to the invention, the electromagnetic radiation also contains an ultraviolet fraction.

In principle, the process according to the invention can be used for any offset printing plate which, in the positive-working light-sensitive layer, contains at least one diazo compound as the light-sensitive component; these compounds are in particular esters or amides of o-naphthoquinone-diazide-sulfonic acids or o-naphthoquinone-diazide-carboxylic acids (see, for example, German Auslegeschrift No. 1,447,963, mentioned above). In addition to the diazo compound component, the light-sensitive layers normally also contain a resin, in particular a novolak and/or a resol, but various additional components, such as dyes or adhesion-promoters, also can be present.

The support materials used for the light-sensitive layers can be those conventional in offset printing technology; in addition to sheets of organic polymers, such as polyesters, which are less suitable for burning-in processes due to their composition which in general is not sufficiently heat-stable, these support materials include, in particular, metal foils based on aluminum, zinc or steel; aluminum plates which have been chemically, mechanically or electrochemically roughened and, if appropriate, also carry an aluminum oxide layer, are preferably used. Frequently, the printing plate support material is additionally also modified on the surface, before the light-sensitive layer is applied, for example by means of aqueous solutions of polyvinylphosphonic acid or sodium silicate.

Additionally, the most diverse auxiliaries also can be used in burning-in before and/or after the thermal treatment step; these include for example:

aqueous hydrofluoric acid, aqueous trisodium phosphate solution, aqueous phosphoric acid or aqueous fluoboric acid for removing the impurities formed during burning-in on the non-image areas of the printing plate, or aqueous phosphoric acid for rendering the non-image areas hydrophilic before burning-in, according to German Auslegeschrift No. 1,447,963 (equivalent to British Pat. No. 1,154,749), aqueous solutions of water-soluble organic substances, such as gum arabic, cellulose ethers, polyacrylic acid, salts of organic acids or anionic surfactants, such as alkylarylsulfonates, and/or aqueous solutions of water-soluble inorganic salts, such as halides, borates, phosphates or sulfates, for modifying the entire plate surface (with a special action rendering the non-image areas hydrophilic) before burning-in, according to German Offenlegungsschrift No. 2,626,473 (equivalent to British Pat. No. 1,555,233), or an aqueous solution of polyvinylphosphonic acid for removing the impurities, formed during burning-in, from the non-image areas of the printing plate, according to German Offenlegungsschrift No. 2,855,393.

The electromagnetic radiation to be used in the process according to the invention, having an IR fraction, a fraction in the visible region and a UV fraction, can be generated using those conventional lamps having an UV fraction which are otherwise used for the exposure of light-sensitive layers on printing plates or of photoresists, and similar lamps are also used in appliances for artificially producing tanning of the skin, for example, in tanning studios or "home suns". Preferably, those lamps are used, the electromagnetic radiation of which has an infrared fraction of 50 to 87 percent, a fraction in the visible region of 10 to 30 percent and an ultraviolet fraction of 3 to 20 percent.

The UV region is here intended to include wavelengths from about 100 nm to about 380 nm, and the IR region is intended to include wavelengths from about 780 to about 1 mm. Lamps which are suitable for this purpose are, in particular, mercury vapor lamps which additionally also can contain a certain fraction of metal halides, such as iron iodide or gallium iodide. The indicated region for the IR fraction relates to air-cooled lamps; in water-cooled lamps, for example, the IR fraction is significantly lower. In the indicated ratios of fractions, the losses due to convection and/or conduction, which are normally encountered in commercially available mercury vapor lamps, were added to the IR fraction. These losses may be of the order of magnitude from about 12 to 30 percent.

The process can be carried out continuously or intermittently and, during burning-in, the exposed and developed layer is advantageously arranged at a uniform distance from the source of electromagnetic radiation, or is moved at a constant distance past the latter, and the printing plate is irradiated from the layer side, in order to minimize the thermal stress on the support. It is even possible to contact the rear of the plate with a cooled base. However, the radiant energy is better utilized, if there is no heat removal from the rear, and the printing plate is fixed relatively freely suspended or freely lying, or is placed or suspended with heat-insulation.

In a preferred embodiment of the process according to the invention, the electromagnetic radiation is caused to act simultaneously and uniformly on the total surface area of the exposed and developed layer, in order to obtain particularly uniform burning-in of all the image areas of the printing plate and the highest possible thermal efficiency.

An even better utilization of the irradiated heat energy can be achieved when the absorption capacity of the exposed and developed layer for IR radiation is increased by the addition of an adsorption aid.

Surprisingly, using the process according to the invention, positive-working light-sensitive layers can be uniformly burned-in within a relatively short time, without thus adversely affecting the mechanical properties of the support materials of these layers to a significant extent, and this can be achieved even with periods of action of the radiation of about 15 to 90 seconds—depending on the distance from the source of radiation, the type of the coating and the support material, or the nature of the suspension or base.

In the examples which follow, parts by weight and parts by volume have the same relationship as the g and the ml, and the percentages are percent by weight. Printing plates of the following composition are used:

Type 1 Printing Plate

A mechanically roughened aluminum foil is coated with a solution of 1.5 parts by weight of the condensation product obtained from 2,3,4-trihydroxy-benzophenone and 1,2-naphthoquinone-2-diazide-5-sulfochloride 0.8 part by weight of the condensation product obtained from 1 mole of 2,2′-dihydroxy-1,1′-dinaphthylmethane and 2 moles of 1,2-naphthoquinone-2-diazide-5-sulfochloride, 0.6 part by weight of a novolak prepared by condensation of a technical cresol mixture with formaldehyde having a softening point of 108° to 118° C. (according to DIN 53,181) and 120 parts by volume of ethylene glycol monomethyl ether, using a rotary base in order to spin off the excess quantity of the solution applied, and the foil is dried initially in a stream of warm air and then for about 2 minutes at 100° C. The light-sensitive layer can be exposed under a diapositive with a carbon arc lamp of 18 ampere current intensity for about 1 minute, at a lamp distance of 70 cm. The exposed layer is developed by wiping with a cottonwool pad which is immersed in 5 percent aqueous trisodium phosphate solution, and is then rinsed with water. During development, the image appears in a brilliant yellow color on a metallic background.

Type 2 Printing Plate

An electrolytically roughened and anodically oxidized aluminum foil is coated with a solution of 2.17 parts by weight of 4-(2-phenyl-prop-2-yl)-phenyl 1,2-naphthoquinone-2-diazide-4-sulfonate, 1.02 parts by weight of the condensation product obtained from 1 mole of 2,2′-dihydroxy-1,1′-dinaphthylmethane and 2 moles of 1,2-naphthoquinone-2-diazide-5-sulfochloride, 0.37 part by weight of 1,2-naphthoquinone-2-diazide-4-sulfochloride, 0.12 part by weight of crystal violet base, 9.90 parts by weight of a cresol/formaldehyde novolak having a softening range of 112° to 118° C. (according to DIN 53,181).

43 parts by volume of tetrahydrofuran, 35 parts by volume of ethylene glycol monomethyl ether and 9 parts by volume of butyl acetate.

After drying, the light-sensitive layer has a strong blue color and, after exposure, it can be developed with a 20 percent aqueous solution of $Na_2SiO_3.9H_2O$.

COMPARISON EXAMPLE V 1

One printing plate of each of types 1 and 2 is cut to a size of 25×18 cm, exposed, developed and subjected for 5 to 6 minutes to a temperature of 240° C. in a commercially available burning-in cabinet (with hot circulating air). The resistance of the burned-in image areas of the printing form is tested by subjecting it to the action of a mixture of various organic solvents (based on acetic anhydride, xylene and dimethylformamide). With the shorter burning-in time, the image areas of the two types of printing plate are still soluble, while the image areas of the samples burned in for 6 minutes are not incipiently dissolved even after a time of action of the solvent mixture of 5 minutes. During this burning-in time, the tensile strength of the support material falls from 166 $N/mm^2$ to 139 $N/mm^2$ (a loss of about 17 percent).

COMPARISON EXAMPLE V 2

One printing plate of each of types 1 and 2 is pretreated as in Comparison Example V 1 and is exposed for 45 seconds or 60 seconds to the radiation of several commercially available IR radiators at a distance of 4 cm. When testing the resistance of the image areas in accordance with the data in Comparison Example V 1, the image areas burned-in for the shorter time are still dissolved, while the image areas of the samples burned-in for 60 seconds are no longer dissolved. With this burning-in time, the tensile strength of the support material falls from 167 $N/mm^2$ to 78 $N/mm^2$ (a loss of about 53 percent), and the support material is no longer usable for application as a printing form.

EXAMPLE 1

One printing plate of each of types 1 and 2 is pretreated as in Comparison Example V 1 and exposed for 25 seconds or 30 seconds at a distance of 25 cm to the radiation of a 5 kW mercury vapor lamp (having a content of gallium iodide) which is commercially available as an irradiation lamp for the exposure of printing plates. The spectral distribution of this lamp is approximately as follows: UV fraction 11 percent, fraction in the visible region 19 percent and IR fraction 71 percent (with a loss of 15 percent). When testing the resistance of the image areas in accordance with the data in Comparison Example V 1, the image areas burned-in for the shorter time are still dissolved, while the image areas of the samples burned in for 30 seconds are no longer dissolved. The tensile strength of the support material falls, even after a burning-in time of 60 seconds, only from 167 $N/mm^2$ to 147 $N/mm^2$ (a loss of about 12 percent).

EXAMPLE 2

A printing plate of type 1 is pretreated as in Comparison Example V 1, and one half is subjected for 8 minutes to a temperature of 230° C. in a commercially available burning-in cabinet, and the other half is exposed for 30 seconds at a distance of 25 cm to the radiation of the lmap indicated in Example 1. In a commercially available printing press having a damping unit operated with an isopropanol/water mixture, about 80,000 good prints can be obtained from both printing forms, i.e., burning-in of positive-working light-sensitive layers by the process according to the invention, at the same layer composition, gives comparable results on printing with these layers after a significantly shorter burning-in time, without deterioration of the support material.

It will be obvious to those skilled in the art that many modifications may be made within the scope of the present invention without departing from the spirit thereof, and the invention includes all such modifications.

What is claimed is:

1. In a process for the preparation of an offset printing form, comprising exposing and developing a single, positive-working light-sensitive layer provided on a support, said layer containing a diazo compound as a light-sensitive ingredient of the light-sensitive layer to be processed, the improvement consisting essentially of burning-in said layer to be processed by heating the printing form to at least 180° C. by exposure to electromagnetic radiation which contains an infrared fraction of 50 to 87 percent, a fraction in the visible region of 10 to 30 percent, and an ultraviolet fraction of 3 to 30 percent, for a period of time between about 15 to 90 seconds which will not adversely affect the mechanical properties of said support to a significant extent, wherein the printing form is irradiated by said electromagnetic radiation from the side of said exposed and developed layer.

2. The process as claimed in claim 1 wherein the electromagnetic radiation acts simultaneously and uniformly on the total surface area of the exposed and developed layer.

3. The process as claimed in claim 1 wherein the side facing away from the radiation is heat-insulated.

4. The process as claimed in claim 1 wherein the absorption capacity of the exposed and developed layer for infrared radiation is increased by the addition of an adsorption aid.

5. The process as claimed in claim 1 wherein, during burning-in, the exposed and developed layer is positioned at a uniform distance from the source of electromagnetic radiation, or is moved at a constant distance past the same.

* * * * *